(12) United States Patent
Yang et al.

(10) Patent No.: US 6,737,121 B2
(45) Date of Patent: May 18, 2004

(54) MULTILAYER ARTICLE AND METHOD OF MAKING BY ARC PLASMA DEPOSITION

(75) Inventors: Barry Lee-Mean Yang, Clifton Park, NY (US); Charles Dominic Iacovangelo, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 9 days.

(21) Appl. No.: 10/046,607

(22) Filed: Jan. 16, 2002

(65) Prior Publication Data

US 2002/0110695 A1 Aug. 15, 2002

Related U.S. Application Data

(62) Division of application No. 09/271,654, filed on Mar. 17, 1999.

(51) Int. Cl.[7] .......................... C23C 16/18; C23C 16/40; C23C 16/513; C23C 14/08
(52) U.S. Cl. ....................... 427/452; 427/489; 427/563; 427/564; 427/580; 427/453; 204/192.38
(58) Field of Search ................................ 427/452, 453, 427/455, 525, 527, 529, 530, 531, 564, 563, 566, 567, 576, 580, 579, 489; 204/192.38

(56) References Cited

U.S. PATENT DOCUMENTS

| | | | |
|---|---|---|---|
| 3,161,615 A | | 12/1964 | Goldberg |
| 3,220,973 A | | 11/1965 | Goldberg |
| 3,312,659 A | | 4/1967 | Kurkjy et al. |
| 3,312,660 A | | 4/1967 | Kurkjy et al. |
| 3,313,777 A | | 4/1967 | Elam et al. |
| 3,576,656 A | | 4/1971 | Webb et al. |
| 3,625,848 A | | 12/1971 | Snaper ........................ 204/192 |
| 3,989,672 A | | 11/1976 | Vestergaard |
| 4,194,038 A | | 3/1980 | Baker et al. |
| 4,200,681 A | | 4/1980 | Hall et al. |
| 4,210,699 A | | 7/1980 | Schroeter et al. |
| 4,224,378 A | | 9/1980 | Schroeter et al. |
| 4,242,381 A | | 12/1980 | Goossens et al. |
| 3,666,614 A | | 6/1982 | Snedeker et al. |
| 4,374,157 A | * | 2/1983 | Barbier et al. ............... 427/580 |
| 4,454,275 A | | 6/1984 | Rosenquist |
| 4,799,745 A | * | 1/1989 | Meyer et al. ........... 204/192.27 |
| 4,842,941 A | | 6/1989 | Devins et al. |
| 4,871,580 A | | 10/1989 | Schram et al. |
| 4,917,953 A | * | 4/1990 | Hioki et al. ................. 427/525 |
| 4,927,704 A | | 5/1990 | Reed et al. |
| 4,948,485 A | | 8/1990 | Wallsten et al. |
| 4,959,257 A | * | 9/1990 | Mukherjee .................. 428/186 |
| 5,008,148 A | | 4/1991 | Thurm et al. |
| 5,019,458 A | * | 5/1991 | Elgat et al. ................. 428/630 |
| 5,051,308 A | | 9/1991 | Reed et al. |
| 5,156,882 A | | 10/1992 | Rzad et al. |
| 5,298,587 A | | 3/1994 | Hu et al. |
| 5,320,875 A | | 6/1994 | Hu et al. |
| 5,342,676 A | * | 8/1994 | Zagdoun ..................... 428/216 |
| 5,433,786 A | | 7/1995 | Hu et al. |
| 5,463,013 A | | 10/1995 | Tokuda et al. |
| 5,480,722 A | | 1/1996 | Tomonaga et al. |
| 5,494,712 A | | 2/1996 | Hu et al. |
| 5,510,448 A | | 4/1996 | Fontane et al. |
| 5,571,332 A | | 11/1996 | Halpern ................. 118/723 HC |
| 5,614,248 A | | 3/1997 | Schiller et al. |
| 5,635,087 A | | 6/1997 | Schiller et al. |
| 5,718,967 A | | 2/1998 | Hu et al. |
| 5,952,108 A | * | 9/1999 | Slootman et al. ............ 427/580 |

FOREIGN PATENT DOCUMENTS

| | | |
|---|---|---|
| DE | 3014258 | 10/1981 |
| EP | 0887437 | 12/1998 |
| WO | 8901957 | 8/1988 |
| WO | 9213517 | 2/1992 |
| WO | 9713802 | 10/1996 |

OTHER PUBLICATIONS

Database WPI, Derwent Publications AN 1993–411476 XP–002138601, "Light Source Apparatus for Weather Resistant Testing of Organic Material", JP 05312715 A, Nov, 22, 1993 abstract.

S. Anders et al., "Formation of Metal Oxides by Cathodic Arc Deposition", 76–77 *Surface and Coatings Technology*, 167–73 (1995), no month.

H. Bolt et al., "Gradient Metal—a–C:H Coatings Deposited From Dense Plasma by a Combined PVD/CVD Process", 98 *Surface and Coatings Technology*, pp. 1518–1523 (1998), no month.

D.E. Brodie et al., "Characterization of ZnO for the Fabrication of Conductor–Insulator–Semiconductor (CIS) Solar Cells", Conf. Proc. for IEEE 14th Photovoltaic Spec. Conf. 468–471 (Jan. 7–10, 1980).

(List continued on next page.)

*Primary Examiner*—Marianne Padgett
(74) *Attorney, Agent, or Firm*—Robert P. Santandrea; Patrick K. Patnode

(57) ABSTRACT

According to an exemplary embodiment of the invention, a method of forming a plurality of layers on an article comprises steps of generating a plasma by forming an arc between a cathode and an anode; injecting a first material comprising an organic compound into the plasma to deposit a first layer on the article; injecting a second material comprising an organometallic material into the plasma to form a second layer on the first layer; and injecting a third material comprising a silicon containing organic compound into the plasma to deposit a third layer on the second layer. The invention also relates to an article of manufacture comprising a substrate; an interlayer disposed on the substrate; a second layer disposed on the interlayer, the second layer comprising an inorganic ultraviolet absorbing material; and a third layer disposed on the second layer, the third layer comprising an abrasion resistant material. The interlayer may comprise a polymerized organosilicon material or a polymerized hydrocarbon material, for example. The second layer may comprise a metal oxide or zinc sulfide, for example. The third layer may comprise an oxidized organosilicon material, for example.

16 Claims, 5 Drawing Sheets

OTHER PUBLICATIONS

D.A. Gerdeman and N.L. Hecht, *Arc Plasma Technology in Materials Science*, pp. (1972), no month.

S. Jager et al., "Comparison of Transparent Conductive Oxide Thin Films Prepared by A.C. and D.C. Reactive Magnetron Sputtering", 98 *Surface and Coatings Technology*, pp. 1304–1314 (1998), no month.

Jianhua Hu and Roy G. Gordon, "Deposition of Boron Doped Zinc Oxide Films and Their Electrical and Optical Properties", vol. 139, No. 7, *J. Electrochem. Soc.*, pp. 2014–2022 (Jul. 1992).

Z.–C. Jin et al., *Optical Properties of Sputter–Deposited ZnO:Al Thin Films*, 64 (10), *J. Appl. Phys.*, pp. 5117–5131 (Nov, 15, 1988).

R.A. MacGill et al., *Cathodic Arc Deposition of Copper Oxide Thin Films*, 78 *Surface and Coatings Technology*, 168–72 (1996), no month.

S. Major et al., "*Electrical and Optical Transport in Undoped and Indium–doped Zinc Oxide Films*", 1(2), *J. Mater. Res.*, pp. 300–310 (1986), Mar./Apr.

S. Major et al., "*Highly Transparent and Conducting Indium–Doped Zinc Oxide Films by Spray Pyrolysis*", 108, *Thin Solid Films*, pp. 333–340 (1983), no month.

S. Maniv et al., "*Transparent Conducting Zinc Oxide and Indium–Tin Oxide Films Prepared by Modified Reactive Planar Magnetron Sputtering*", A1(3), *J. Vac. Sci. Tech.*, pp. 1370–1375 (Jul./Sep. 1983).

Tadatsugu Minami et al., *Group III Impurity Doped Zinc Oxide Thin Films Prepared by RF Magnetron Sputtering*, vol. 24, No. 10, *Japanese J. of Appl. Phy*, pp. L781–L784, (Oct. 1985).

Tadatsugu Minami et al., *Highly Conductive and Transparent Silicon Doped Zinc Oxide Thin Films Prepared by RF Magnetron Sputtering*, vol. 25, No. 9, *Japanese J. of Appl. Phys.*, pp. L776–L779, (Sep. 1986).

M. Miyazaki and E. Ando, "*Durability Improvement of Ag–Based Low–Emissivity Coatings*", 178, *J. Non–Crystalline Solids*, pp. 245–249 (1994), no month.

C.X. Qiu and I. Shih, "*Tin– and Indium–Doped Zinc Oxide Films Prepared by RF Magnetron Sputtering*", 13 *Solar Energy Materials*, pp. 75–84 (1986), no month.

D. Raviendra and J.K: Sharma, "Electroless Deposition of Cadmium Stannate, Zinc Oxide, and Aluminum–Doped Zinc Oxide Films", 58(2), *J. Appl. Phys.*, pp. 838–844 (Jul. 1985).

R.E.I. Schropp et al., "Transparent and Conductive Thin Films of ZnO for Photovoltaic Applications Prepared by RF Magnetron Sputtering", 1, Conf. Rec. of 20th IEEE Photovoltaic Spec. Conf. 273–276 (Sep. 26, 1988).

B.E. Sernelius et al., Band–Gap Tailoring of ZnO by Means of Heavy Al Doping, vol. 37, No.:17, Physical *Review B of Am. Phys. Soc.*, pp. 10244–10248 Jun. 15, 1988.

I. Shih and C.X. Qiu, "Indium–Doped Zinc Oxide Thin Films Prepared by RF Magnetron Sputtering", 58(6), *J. Appl. Phys*, pp. 2400–2401 (Sep. 15, 1985).

S. Sreedhara Reddy et al., "Optical Properties of Spray Deposited ZnO Films, vol. 77, No. 12, Solid State Communications", pp. 899–901 (1991), no month.

K.J. Saunders, *Organic Polymer Chemistry*, excerpt from pp. 388–411 (2d ed., no month 1998).

* cited by examiner

MULTILAYER ARTICLE AND METHOD OF MAKING BY ARC PLASMA DEPOSITION

This is a division of application Ser. No. 09/271,654, filed Mar. 17, 1999.

BACKGROUND

1. Field of the Invention

This invention relates generally to a method of forming a multilayer article, and more particularly to a method for depositing multiple layers on an article with a plasma generated by an arc between a cathode and an anode.

2. Description of the Related Art

Plastics and other polymers are commercially available materials possessing physical and chemical properties which are useful in a wide variety of applications. For example, polycarbonates are a class of polymers which, because of their excellent breakage resistance, have replaced glass in many products, such as automobile head-lamps, safety shields, eyewear, and windows. However, many polycarbonates also have properties which may be disadvantageous in some applications, such as low abrasion resistance and susceptibility to degradation from exposure to ultraviolet (UV) light. Thus, polycarbonates are not commonly used in applications such as automotive and other windows which are exposed to ultraviolet light and physical contact from a variety of sources.

To minimize the problems of low abrasion resistance and UV degradation, known methods of treating polycarbonates involve the application of layers of abrasion resistant material and UV absorbing material to the polycarbonate substrate. For example, U.S. Pat. No. 5,156,882 to Rzad et al. discloses a method of preparing transparent plastic articles having an improved protective stratum which provides protection from UV light and abrasion. The article includes a polycarbonate substrate and a multi-layered coating applied to the polycarbonate substrate by plasma enhanced chemical vapor deposition (PECVD). Plasma enhanced chemical vapor deposition is a significant improvement over conventional chemical vapor deposition (CVD) because PECVD can be used to deposit materials on plastic substrates such as polycarbonates, which was generally not feasible with CVD at temperatures lower than the glass transition temperature of the plastic. In PECVD, the applied electric field enhances the formation of the ionized species, providing a much higher percentage of ionized species which thereby permits the use of low deposition temperatures, e.g. as low as room temperature.

Another method of treating polycarbonates involves the application of what is conventionally known as a silicone hardcoat to the polycarbonate substrate. Examples of silicone hardcoats are described, for example, in U.S. Pat. Nos. 4,842,941; 4,927,704; and 5,051,308, incorporated herein by reference. The silicone hardcoat is applied in a wet process, for example by dipping the polycarbonate in a silicone bath or by spraying silicone on the polycarbonate. The silicone hardcoat provides abrasion resistance to the polycarbonate and may also include a constituent which absorbs UV radiation.

The above methods of treating polycarbonates, however, suffer from certain disadvantages. For example, PECVD still does not generally provide a deposition rate which is high enough to be commercially viable for many applications involving polycarbonates coated with UV absorbing and abrasion resistant layers. With respect to silicone hard coating, this process is also relatively slow, since the silicone hardcoat must be dried and cured which can take a few hours. Silicone hardcoating has additional disadvantages including a limited shelf life of the solution, the generation of waste chemicals, and a potentially nonuniform thickness due to migration of the fluid coating during drying and curing.

It would be desirable, therefore, to have a method of forming multilayer articles which was effective at protecting the article from abrasion and UV radiation and which could be executed rapidly and effectively to reduce manufacturing costs.

SUMMARY

According to an exemplary embodiment of the invention, a method of forming a plurality of layers on an article comprises the steps of flowing a plasma gas in at least one plasma generation chamber, the at least one plasma generation chamber being in communication with a deposition chamber, the deposition chamber having a lower pressure than the at least one plasma generation chamber, the article being disposed in the deposition chamber, generating at least one arc in the at least one plasma generation chamber to create at least one plasma which flows into the deposition chamber, injecting a first material into the at least one plasma to form a first layer on the article, and injecting a second material into the at least one plasma to form a second layer on the first layer, the second material comprising a gaseous reagent.

The invention also relates to an article of manufacture comprising a substrate; an interlayer disposed on the substrate, the interlayer comprising a polymerized organic material; a second layer disposed on the interlayer, the second layer comprising an inorganic ultraviolet absorbing material; and a third layer disposed on the second layer, the third layer comprising an abrasion-resistant material. The interlayer may comprise a polymerized organosilicon material or a polymerized hydrocarbon material, for example. The second layer may comprise a metal oxide or sulfide, for example. The third layer may comprise an oxidized organosilicon material, for example.

According to exemplary embodiments of the invention, the three layers can be applied successively in a short time, due to relatively high deposition rates, e.g. about 5–30, typically 6–15 microns/minute for the interlayer, about 2–8, typically 5–8 microns/minute for the UV absorbing layer, and about 5–20, typically 12–15 microns/minute for the abrasion resistant layer. For example, the three layers can be applied successively in a total deposition time of less than 45 seconds, without cooling between layers. The method can produce articles having a high UV absorbance and a high abrasion resistance. The method also allows relatively large surface areas to be coated with the use of a divergent nozzle.

BRIEF DESCRIPTION OF THE DRAWINGS

Other features and advantages of the invention will be apparent from the following detailed description and the accompanying drawings, in which.

DETAILED DESCRIPTION OF THE PREFERRED EMBODIMENTS

Figure 1:
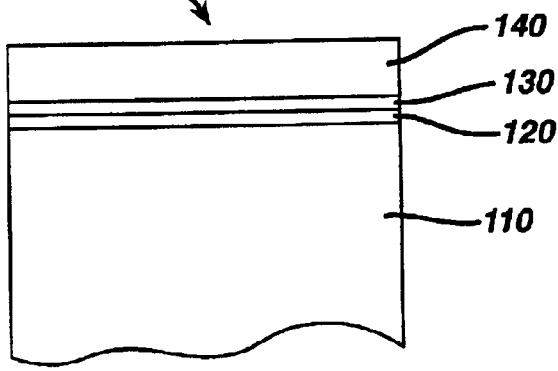
FIG. 1 is a drawing of a multilayer article according to an exemplary embodiment of the invention.

FIG. 1 shows a cross section of a multilayer article according to an exemplary embodiment of the invention. The multilayer article 100 comprises a substrate 110, an interlayer 120, an ultraviolet (UV) radiation absorbing layer 130, and an abrasion resistant layer 140. The layers 120, 130, 140 are typically deposited successively on the substrate 110 by arc plasma deposition, as will be described with reference to FIGS. 2 and 3. Although the three-layer article shown in FIG. 1 is a preferred embodiment, other embodiments of the invention may include less than three layers, e.g., a UV absorbing layer and an abrasion resistant layer.

In the arc plasma deposition process, an arc is generated between a cathode and an anode which are located in a first chamber. The anode typically has a central aperture, for example in the form of a portion of a diverging cone, which is in communication with a low pressure second chamber. An inert carrier gas, introduced proximate to the cathode, is ionized by the arc between the cathode and anode to form a plasma. The plasma flows into the second chamber at high velocity as a plasma jet due to the pressure difference between the first and second chambers. Upon entering the second chamber, one or more materials are fed into the plasma, which projects the materials onto the substrate, and which also enables the materials to undergo reactions such as polymerization, oxidation, decomposition, etc. The second chamber may include a diverging, e.g. conical, nozzle which extends from the diverging aperture of the anode. The nozzle at its narrow end concentrates the plasma and deposition materials to enhance chemical reactions. At the wide end of the nozzle, the area of the plasma is substantially increased to provide a larger deposition area.

Figure 2:
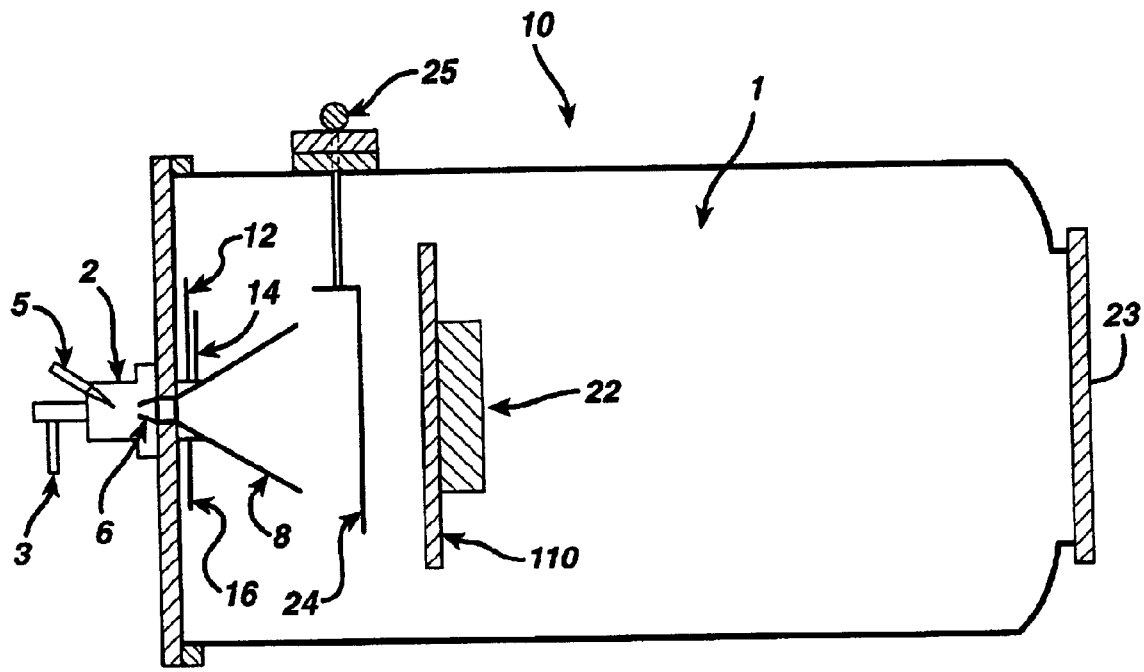
FIG. 2 is a drawing of an exemplary arc plasma deposition apparatus.

FIG. 2 illustrates an example of an arc plasma deposition apparatus which can be used to form multilayer articles according to exemplary embodiments of the invention. The apparatus 10 includes a deposition chamber 1, a plasma generation chamber 2, and a nozzle 8. The plasma generation chamber 2 is supplied with an ionizable gas such as nitrogen, ammonia, carbon dioxide, hydrogen, or a noble gas, e.g. argon or helium, or any mixture thereof, via a gas supply line 3. The nozzle 8 includes an oxygen supply line 12 and two reagent supply lines 14, 16 which can be operated individually or in combination. A vacuum pumping system (not shown) maintains a low pressure within the deposition chamber 1 via outlet 23. The substrate 110 is supported in the deposition chamber 1 on a temperature controlled support 22 which may be used to control the temperature of the substrate 110 prior to deposition, for example. A retractable shutter 24 is adapted for manual positioning by a handle 25 or automatic positioning between the substrate 110 and the nozzle 8 in the path of the plasma jet.

Figure 3:
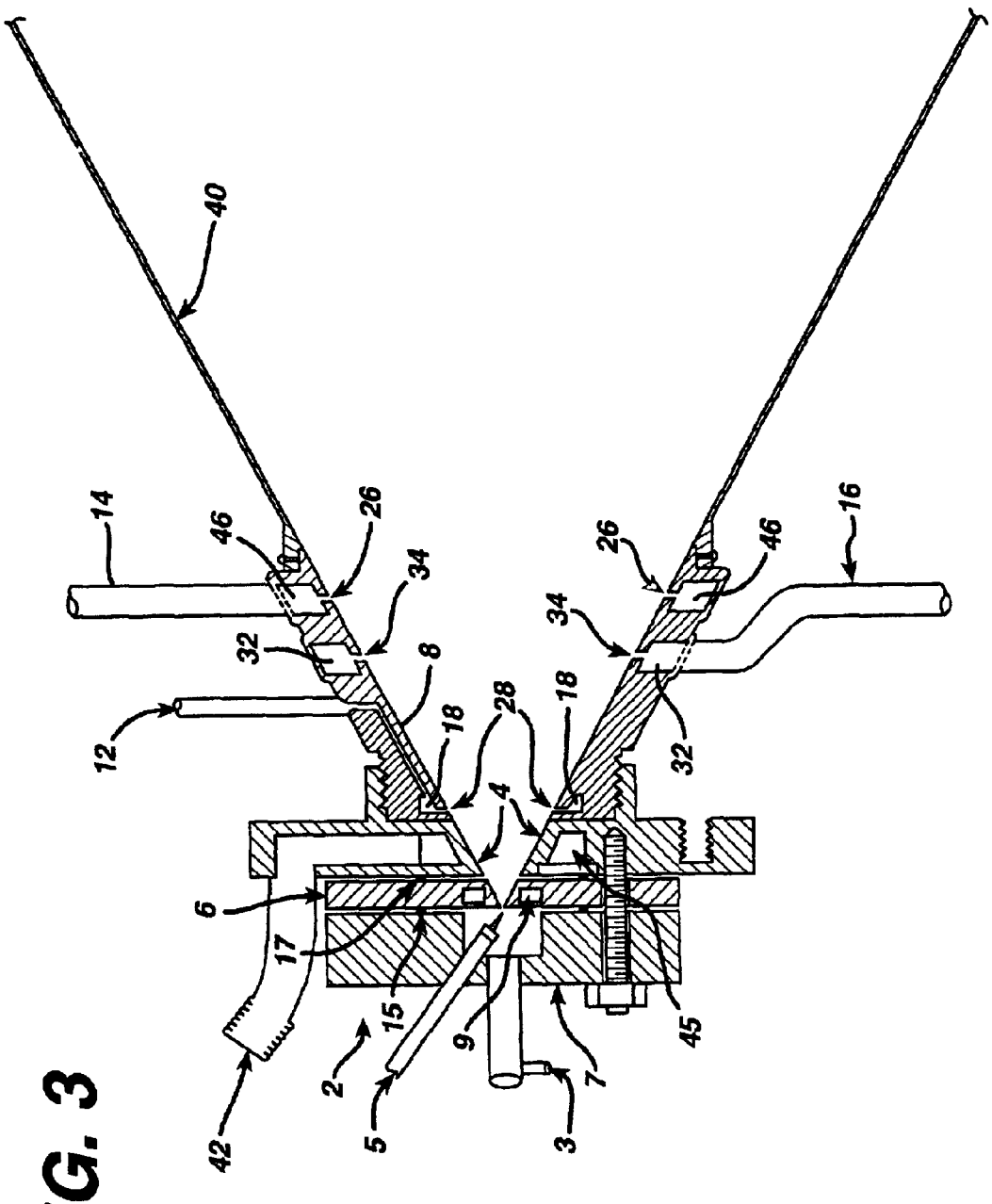
FIG. 3 is a drawing of the nozzle and plasma generator from the arc plasma deposition apparatus of FIG. 2.

FIG. 3 is an enlarged view of the plasma generation chamber 2 and nozzle 8 of FIG. 2. In FIG. 3, the plasma is generated by a current of electrons flowing from at least one cathode 5 to an anode 4. Typically, the apparatus includes a plurality of equally spaced apart cathodes, e.g. 3 cathodes, only one of which is shown in FIG. 3. The cathodes 5 can be water cooled. The cathodes 5 are mounted in a cathode housing 7 which is mounted on a plate 6. The plate 6 may include a cooling water channel 9 which is supplied via a water line, not shown. Cooling water for the anode 4 is supplied by a water line 42 and flows through a conduit 45 within the body of the anode 4.

The plate 6 has a central gas plasma channel of divergent, e.g. conical, configuration, as shown in FIG. 3. The plate 6, which may be formed of copper, is electrically isolated from the anode 4 and cathode 5. The plate 6, sometimes referred to as a cascade plate, provides what is conventionally know as a "cascaded arc" configuration which affects the spatial distribution of the voltage drop of the plasma from the cathode 5 to the anode 4. The plate 6 will typically have a voltage which is roughly midway between the voltage of the cathode 5 and the voltage of the anode 4. Additional plates 6 (only one is shown in FIG. 3) can be provided to further control the spatial distribution of the voltage drop between the cathode 5 and anode 4. The total voltage drop between the cathode 5 and the anode 4 will be divided into a number of discrete drops corresponding to the number of plates 6 plus one. The cascaded arc configuration provides a greater area between the cathode 5 and the anode 4 in which the gas can be ionized. The cascaded arc configuration also promotes the stability of the arc.

The ionizable gas, e.g. argon, is supplied to the plasma generation chamber through the gas line 3. The vacuum within the deposition chamber 1 is maintained in part by sealing O-rings 15 and 17. Oxygen is supplied to the nozzle 8 through the line 12 which communicates with a circular conduit 18 and a slit injector 28. The reagent is supplied via a line 14 which feeds a conduit 46 having evenly spaced injection holes 26. The nozzle 8 may have a secondary reagent supply line 16 connected to a conduit 32 having evenly-spaced injection holes 34. The secondary reagent supply line 16 can be used to feed another reactive gas or diluent gas to the activation or reaction zone within the nozzle 8.

The nozzle 8 is typically conical in shape with the wide end directed towards the substrate 110. The nozzle may have a divergence angle (measured from one inner wall to the opposite inner wall) of between 25 and 60 degrees, for example, typically 40–50 degrees. The nozzle 8 may include an extension 40 for directing the plasma and reactive species towards the substrate 110 to be coated. The extension 40 can be an integral part of the nozzle 8 or it can be designed as a removable member. As shown in FIG. 3, the extension 40 has the same degree of divergence as the nozzle 8. The extension 40 can vary from the shape and geometry of the anode plasma channel and the nozzle 8, for example by having a flared or bell shaped mouth.

The nozzle 8 and the extension 40 are typically designed to achieve two objectives, among others. First, the nozzle 8 has a narrow end, i.e. adjacent to the anode 4, which partially encloses or confines the plasma. Partial enclosure or confinement of the plasma allows the plasma, as well as the injected reagents, to be concentrated in a relatively small region. The reagents are preferably introduced near an energetic region of the plasma resulting in the production of a large percentage of active species in the plasma and a correspondingly high rate of deposition on the substrate, e.g. many microns per minute.

Second, the nozzle 8 has a wide end, i.e. opposite the anode 4, which allows the plasma to cover a relatively large area of the substrate for deposition of large areas, e.g. 10–20 centimeters in diameter. The combination of these two factors can increase the speed of deposition dramatically, e.g. up to 100 times with respect to PECVD. Additional details of the arc plasma deposition apparatus axe described in commonly-owned U.S. Pat. No. 6,213,049, entitled "Nozzle-Injector for Arc Plasma Deposition Apparatus", issued on Apr. 10, 2001, to Barry Yang, which is hereby incorporated by reference.

Referring again to FIG. 1, the substrate 110, according to exemplary embodiments of the invention, typically comprises a polymer resin. For example, the substrate may comprise a polycarbonate. Polycarbonates suitable for forming the substrate are well-known in the art and generally comprise repeating units of the formula:

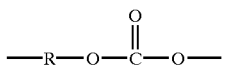

where R is a divalent aromatic radical of a dihydric phenol (e.g., a radical of 2,2-bis(4-hydroxyphenyl)-propane, also known as bisphenol A) employed in the polymer producing reaction; or an organic polycarboxylic acid (e.g. terphthalic acid, isophthalic acid, hexahydrophthalic acid, adipic acid, sebacic acid, dodecanedioic acid, and the like). These polycarbonate resins are aromatic carbonate polymers which may be prepared by reacting one or more dihydric phenols with a carbonate precursor such as phosgene, a haloformate or a carbonate ester. One example of a polycarbonate which can be used is LEXAN®, manufactured by General Electric Company.

Aromatic carbonate polymers may be prepared by methods well known in the art as described, for example, in U.S. Pat. Nos. 3,161,615; 3,220,973; 3,312,659; 3,312,660; 3,313,777; 3,666,614; 3,989,672; 4,200,681; 4,842,941; and 4,210,699, all of which are incorporated herein by reference.

The substrate may also comprise a polyestercarbonate which can be prepared by reacting a carbonate precursor, a dihydric phenol, and a dicarboxylic acid or ester forming derivative thereof. Polyestercarbonates are described, for example, in U.S. Pat. Nos. 4,454,275; 5,510,448; 4,194,038; and 5,463,013.

The substrate may also comprise a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermoset materials include epoxy and urea melamine.

Acrylic polymers, also well known in the art, are another material from which the substrate may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate. Polyesters are well-known in the art, and may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials which can be used to form the substrate. Polyurethanes are well-known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate may be formed include acrylonitrile-butadiene-styrene, glass, VALOX® (polybutylenephthalate, available from General Electric Co.), XENOY® (a blend of LEXAN® and VALOX®, available from General Electric Co.), and the like.

The substrate can be formed in a conventional manner, for example by injection molding, extrusion, cold forming, vacuum forming, blow molding, compression molding, transfer molding, thermal forming, and the like. The article may be in any shape and need not be a finished article of commerce, that is, it may be sheet material or film which would be cut or sized or mechanically shaped into a finished article. The substrate may be transparent or not transparent. The substrate may be rigid or flexible.

The substrate can be washed if desired, e.g. with isopropyl alcohol, and vacuum dried at about 80° C. overnight before plasma deposition, if desired. The substrate can also be cleaned in situ with a plasma pretreatment cleaning step (also referred to as "etching") in which the plasma is generated with argon or with argon and oxygen to remove or oxidize contaminants on the surface of the substrate prior to deposition.

After formation of the substrate 110, the substrate 110 is placed in the deposition chamber 1 on the support 22. The pressure in the deposition chamber 1 is then reduced to about 0.133 Pa (1 milliTorr) or less. The flow of argon through the supply line 3 is then commenced, and a direct current (DC) voltage is applied across the cathodes 5 and anode 4 to generate a plasma. Due to the pressure drop into the deposition chamber 1, the plasma expands through the nozzle 8, forming a plasma jet. The nozzle 8 typically has a temperature of about 200° C. during operation. The substrate typically has a temperature of about 20–130° C. during operation.

Typically, the argon plasma is established with the shutter 24 inserted between the substrate 110 and the nozzle 8. To begin deposition of the first layer 120, the shutter 24 is retracted and a first material is injected into the plasma.

According to one embodiment of the invention, the first layer comprises an interlayer. The term "interlayer" refers to a layer 120 situated between the substrate 110 and the UV absorbing layer 130. The interlayer 120 typically has a coefficient of thermal expansion (CTE) which is between the CTE of the substrate 110 and the CTE of the UV absorbing layer 130. The interlayer 120 improves the adhesion between the UV absorbing layer 130, which is typically inorganic, and the substrate 110, which is typically organic. Without the compliant interlayer 120, the bond between the organic substrate, e.g. a polycarbonate, and the inorganic UV absorbing layer, e.g. a metal oxide, may experience cracking, delamination, and blistering, primarily due to the difference in chemical nature and thermal expansion coefficients of the two materials.

Typically, the interlayer 120 comprises one or more silicon-containing organic materials which may be polymerized in the plasma. The interlayer 120 can also comprise one or more hydrocarbons which are plasma polymerized.

Plasma polymerization, which refers to polymerization of a monomer by the plasma, is an effective polymerization method as compared with conventional polymerization, because plasma polymerization does not require the presence of an unsaturated bond in the monomer, as is typically the case with conventional polymerization.

Typically, the material which is injected into the plasma to form the interlayer 120 is not oxidized, because the introduction of oxygen may result in a coefficient of thermal expansion which is close to the CTE of the UV absorbing layer, thus reducing the functionality of the interlayer. It is within the scope of the invention, however, that some oxygen may be introduced during formation of the interlayer. For example, the ratio of the volumetric flow rate of oxygen to the volumetric flow rate of organosilicon may range from 0:1 to about 3:1.

Examples of materials which can be injected into the plasma to form the interlayer 120 include organosilicons, as well as hydrocarbons such as ethylbenzene and straight chain hydrocarbons such as butane. "Organosilicon" as used herein is meant to embrace organic compounds in which at least one silicon atom is bonded to at least one carbon atom, and includes silicone materials, as well as materials commonly referred to as silanes, siloxanes, silazanes, and organosilicones. Many of the organosilicons suitable for the method and article of the present invention are described in Organic Polymer Chemistry, K. Saunders, Chapman and Hall Ltd., 1973.

Non-limiting examples of organosilicon compositions useful for the present invention are compounds represented by the general formula:

$$R^1_n SiZ_{(4-n)}$$

wherein $R^1$ represents a monovalent hydrocarbon radical or a halogenated monovalent hydrocarbon radical, Z represents a hydrolyzable group, and n may vary between 0 and 2. More specifically, Z is typically a member such as halogen, alkoxy, acyloxy, or aryloxy. Such compounds are well-known in the art and are described, for example, in U.S. Pat. No. 4,224,378 to Schroeter et al., incorporated herein by reference.

Other exemplary organosilicons falling within the scope of the present invention include silanols having the formula:

$$R^2 Si(OH)_3$$

wherein $R^2$ is selected from the group consisting of alkyl radicals containing from about 1 to about 3 carbon atoms, the vinyl radical, the 3,3,3-trifluoropropyl radical, the gamma-glycidoxypropyl radical and the gamma-methacryloxypropyl radical, with at least about 70% by weight of the silanol being $CH_3Si(OH)_3$. Such compounds are described in U.S. Pat. No. 4,242,381, which is hereby incorporated by reference. Examples of organosilicon compounds for forming the interlayer 120 include octamethylcyclotetrasiloxane (D4), tetramethyldisiloxane (TMDSO), and hexamethyidisiloxane (HMDSO).

During plasma polymerization, the monomer precursor becomes polymerized to form, for example, a polymerized D4, HMDSO, or TMDSO interlayer. The interlayer may be deposited at a deposition rate of about 12 microns per minute. The interlayer may have a thickness of between 10 nm and 10 microns, for example. Typically, the interlayer has a thickness between about 250 and 750 nm. The interlayer may be about 500 nm thick, according to one example of the invention.

The UV absorbing layer 130 is deposited on the interlayer 120 also by arc plasma deposition. To deposit the UV absorbing layer, the flow of the organosilicon or hydrocarbon into the plasma is stopped, and the flow of another material is initiated. The transition between formation of the interlayer 120 and formation of the UV absorbing layer 130 may be made simply by injecting another material without interrupting generation of the plasma.

The transition may also be carried out to provide a gradual transition between materials, i.e. a graded composition. This may be accomplished by initiating injection of the material for the UV absorbing layer prior to terminating injection of the material for the interlayer. The graded transition can provide the advantage of improved adhesion between the interlayer and the UV absorbing layer, since there is no abrupt transition between materials having different properties.

Examples of materials which can be injected into the plasma to form the UV absorbing layer include organometallic compounds containing zinc, titanium, or cerium, for example. Organometallic compound refers to an organic compound comprising a metal attached directly to a carbon. Preferred examples of organometallic compounds include zinc-containing compounds such as diethyl zinc (DEZ) or dimethyl zinc (DMZ). Oxygen is typically injected with the zinc containing compound to oxidize the zinc to form a UV absorbing zinc oxide layer. Alternatively, sulfur can be injected with DEZ or DMZ to form a UV absorbing zinc sulfide layer. Other UV-absorbing layers may include metal oxides such as titanium dioxide ($TiO_2$), formed from titanium isopropoxide (Ti-IPO) and oxygen, cerium dioxide ($CeO_2$), formed from cerium IV tetrabutoxide ($C_{16}H_{36}O_4Ce$) and oxygen, and ZnO doped with one of the following dopants: indium, aluminum, fluorine, boron, gallium, thallium, copper, and iron. Indium doped ZnO provides the advantages of good infrared (IR) radiation reflection, adhesion, and stability, as described in U.S. Pat. No. 6,261,294, entitled "Infrared Reflecting Coatings", issued on Jul. 17, 2001, to Charles Iacovangelo, which is hereby incorporated by reference. Indium may suitably comprise 2 to 15 atomic percent of the total metal content of the IZO layer.

The UV absorbing metal oxide layer generally has a thickness of between 100 nm and 10 microns, typically between 200 nm and 1 micron, more typically between 300 nm and 600 nm. The UV absorbing layer typically has an absorbance of greater than 1, typically greater than 2, where "absorbance" is defined as $\log(I_i/I_o)$, where $I_i$ is the intensity of 350 nm light incident on the deposit and $I_o$ is the output intensity. Preferably, the UV absorbing layer comprises an inorganic material such as a metal oxide to provide the advantage that the inorganic material is not consumed or degraded in absorbing UV radiation, as is commonly the case with organic materials.

EXAMPLES 1–7

Table 1 shows examples of properties of UV absorbing zinc oxide layers which were formed by arc plasma deposition under varying conditions. In Table 1, "Zn source" is the zinc source; "Zn rate" is the rate of injection of the organometallic material in standard liters per minute (slm); "$O_2$ rate" is the rate of oxygen injection in slm; "O:Zn" is the ratio of the rate of moles of oxygen injected to the rate of moles of zinc injected. "O:St" is the ratio of the rate of moles of oxygen injected to the rate of oxygen which would be theoretically necessary to achieve a stoichiometric reaction; "WD" is the working distance in centimeters (cm) from the anode to the surface of the substrate; "Pressure" is the pressure in milliTorr (mT) in the deposition chamber; "Substrate temp" is the maximum temperature of the surface of the substrate during deposition in degrees Celsius; "Deposition time" is the deposition time in seconds; "Thickness" is the thickness of the deposit in angstroms (Å); and "Absorbance" is the absorbance of light having a wavelength of 350 nanometers (UV), defined as $\log(I_i/I_o)$, where $I_i$ is the intensity incident on the deposit and $I_o$ is the output intensity. The deposits were made on glass substrates. The argon injection rate was 1.25 slm. The plasma current was 50 amps. The pretreatment time, in which argon was the only constituents injected, was 5 seconds.

TABLE 1

| Example | 1 | 2 | 3 | 4 | 5 | 6 | 7 |
|---|---|---|---|---|---|---|---|
| Zn source | DEZ | DEZ | DMZ | DMZ | DMZ | DMZ | DMZ |
| Zn rate slm | 0.28 | 0.28 | 0.73 | 0.73 | 0.73 | 0.73 | 0.73 |
| $O_2$ rate slm | 3.2 | 3.2 | 3.2 | 3.2 | 5.2 | 6.7 | 6.7 |
| O:Zn | 23 | 23 | 8.8 | 8.8 | 14 | 18 | 18 |
| O:St | 1.633 | 1.633 | 1.096 | 1.096 | 1.781 | 2.295 | 2.295 |
| WD (cm) | 25.5 | 28 | 28 | 25.5 | 23.5 | 23.5 | 23.5 |
| Pressure (mT) | 51 | 55 | 55 | 55 | 55 | 55 | 55 |
| Substrate temp (° C.) | 60 | 60 | 60 | 60 | 25 | 25 | 25 |
| Deposition time (s) | 12 | 12 | 4 | 4 | 4 | 4 | 4 |
| Thickness (Å) | 8711 | 9525 | 7987 | 6500 | 4500 | 5000 | 4800 |
| Absorbance | 1.24 | 0.81 | 0.21 | 0.936 | 1.62 | 2.51 | 2.29 |
| Comment | no cracks | coating cracked | coating cracked | no cracks | no cracks | no cracks | no cracks |

The UV absorbance (also referred to as "optical density" or "OD") is typically the most important property of the UV absorbing layer. For many applications, the value of absorbance is greater than 1, typically greater than 1.5, more typically greater than 2.0. As shown in Examples 6 and 7 of Table 1, a high UV absorbance, e.g. greater than 2.0, can be achieved with dimethyl zinc as the zinc source and a relatively high oxygen flow rate, e.g. about 6.7 slm. This flow rate of oxygen, i.e. 6.7 slm, is 2.295 (O:St) times greater than the theoretical flow rate, 2.9 slm, which would be necessary to carry out the following stoichiometric reaction:

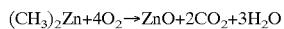

$$(CH_3)_2Zn + 4O_2 \rightarrow ZnO + 2CO_2 + 3H_2O$$

In general, the flow rate of oxygen is preferably sufficiently large to enable the formation of a crystalline zinc oxide layer, as opposed to an amorphous zinc oxide layer which is formed with a lower flow rate of oxygen. The ratio O:St is typically greater than 1, and may be greater than 2, for example.

Another factor which may be important in production is the deposition rate. For example, if the process of depositing the UV absorbing layer is carried out quickly, the thermal load on the substrate is reduced, which can be important with substrates such as polycarbonates having low glass transition temperatures. If the thermal load is reduced sufficiently, the manufacturing process can be expedited because layers can be deposited successively without intermittent cooling. As indicated in Table 1, a UV absorbing layer having a thickness of about 0.5 microns can be deposited in about 4 seconds. This deposition rate, 7–8 microns per minute, is achievable with DMZ as the starting material, as shown in the table.

The working distance from the anode 4 to the substrate 110 is another factor which has an effect on the deposition. In general, as the working distance decreases, the deposition area decreases and the thermal load on the substrate increases. As the working distance increases, the deposition rate (microns per minute) decreases and certain properties of the coating may be degraded. For example, cracking may occur due to a decrease in temperature of the reagents at the substrate, and an amorphous, as opposed to crystalline, zinc oxide layer having a lower absorbency may be caused by a greater loss of oxygen to the deposition chamber. Typically, the working distance is chosen to be large enough to avoid thermal damage to the substrate, but small enough to avoid the problems (e.g. cracking and amorphous formation) associated with excessive cooling of reagents and loss of oxygen to the deposition chamber. Typically, the working distance is between about 20 and 40 centimeters.

According to another embodiment of the invention, the zinc, and any desired zinc dopants such as indium or aluminum or others mentioned above, are supplied to the plasma in the form of a vapor. For example, ZnO, indium doped zinc oxide (IZO), and aluminum doped zinc oxide (AZO) coatings can be deposited onto a polycarbonate substrate at high rates by thermally evaporating Zn, In, and Al into the plasma.

In general, metals having sufficient vapor pressures (e.g. greater than 0.1 Torr) at low temperatures to provide an adequate flow rate can be used. Metals having lower vapor pressures can be utilized, however the temperature of the nozzle should be kept at an even higher temperature.

Figure 4:
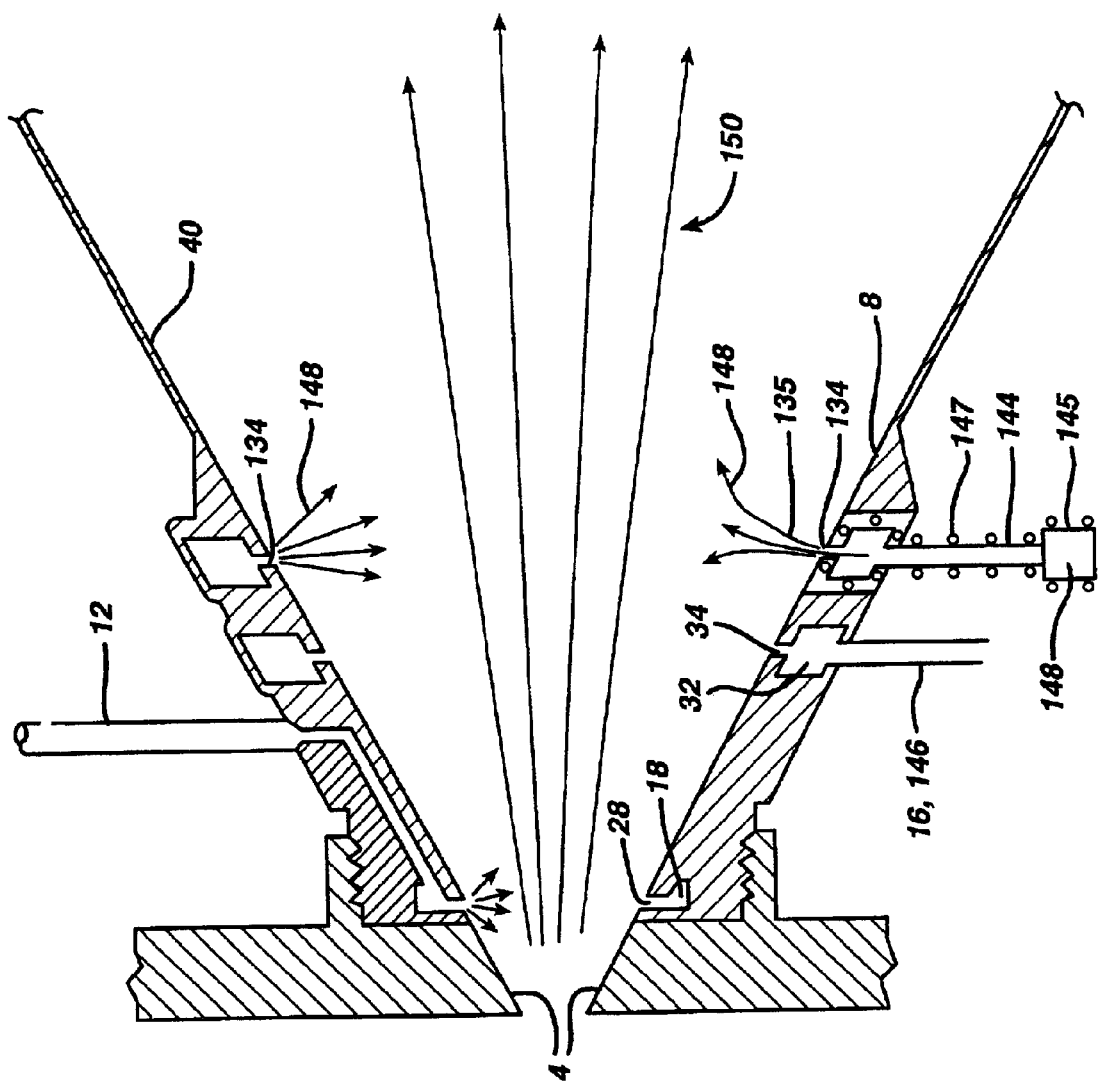
FIG. 4 is a drawing of another embodiment of an arc plasma deposition apparatus which includes a crucible for evaporation of a reagent.

To generate a metal vapor, the metal supply line may be altered as shown in FIG. 4. The metal supply line 14 (or 12 or 16, as necessary) is replaced by a conduit or tube 144, such as a stainless steel tube. The tube 144 is attached to an evaporator 145. In this example, evaporator 145 comprises a crucible, such as a nickel crucible with a tantalum liner. The crucible is surrounded by a heating element 147, such as a high resistance wire or radio frequency (RF) coils. The heating element is also wrapped around the tube 144. The heating element is kept at a temperature sufficient to prevent the reactant metal from solidifying in the tube 144. Preferably, the heating element 147 also extends to the nozzle 8 to prevent the metal from solidifying therein. For example, the nozzle 8 can be thermal wrapped to maintain a sufficient temperature to prevent clogging, such as if the vapor were cooled to the point where the reactant returned to its condensed phase.

The metal reactant 148 is loaded into the evaporator 145 such that the reactant abuts the pipe 144. The heating element is activated to evaporate the metal reactant 148 into the pipe 144. The metal reactant is then fed into the plasma 150 from pipe 144 through channel 135 and openings 134. For example, to deposit a ZnO film, the metal reactant is zinc, which is commercially available in the form of Zn slugs. To deposit an IZO film, the metal reactant 148 may be a In:Zn alloy, such as 2.5 atomic % In:Zn.

Alternatively, indium vapor may be supplied through a separate conduit than the zinc vapor. In this embodiment, the second metal supply line 16 is replaced with a second tube 146 and a second crucible containing indium. The zinc and/or indium vapor enter the plasma, where its mixes with oxygen supplied through supply line 12. The metal and oxygen reactants mix in the plasma 150 to form ZnO or IZO which deposits on the substrate 110 as a thin film as the plasma strikes the substrate.

Figure 5:
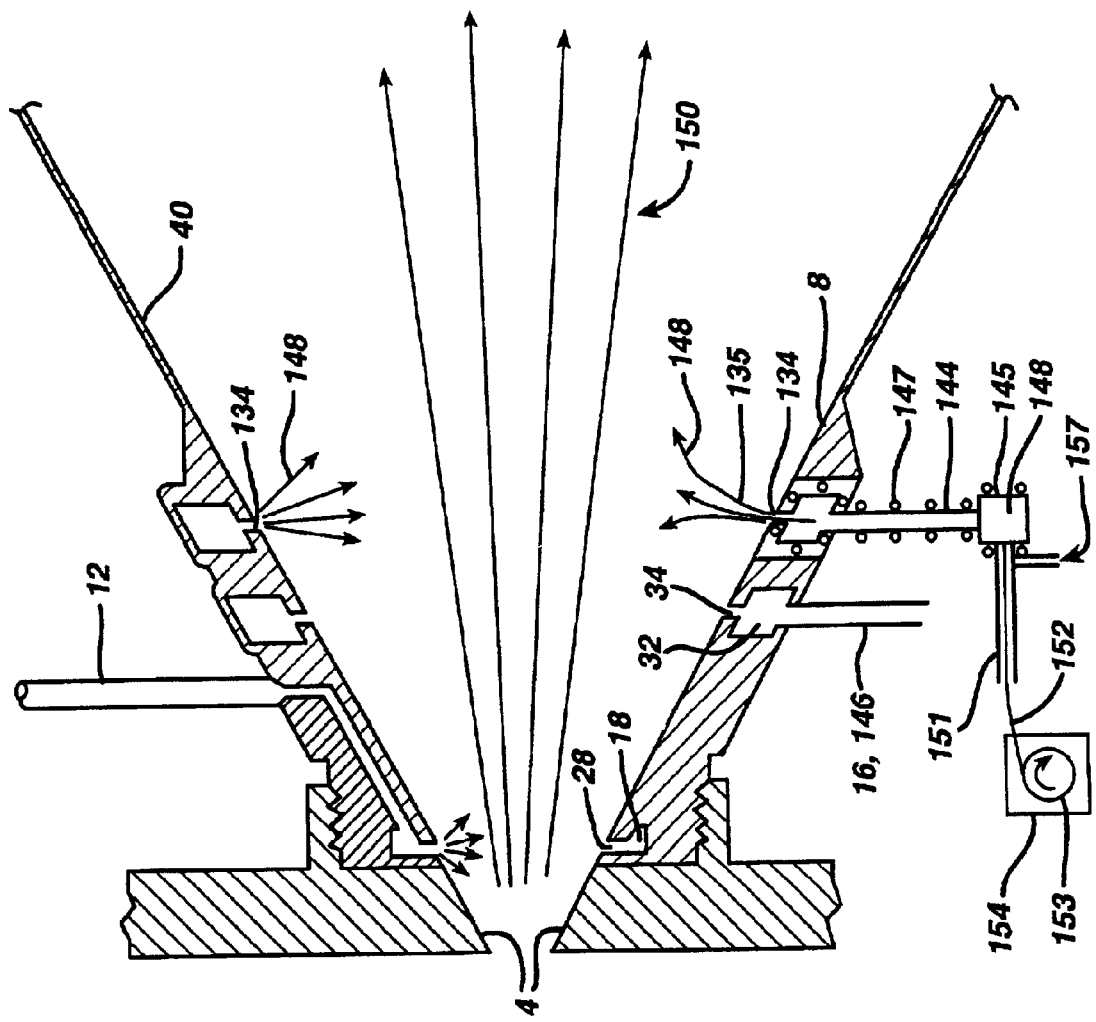
FIG. 5 is a drawing of another embodiment of the invention which includes a wire feed mechanism and evaporator.

Another embodiment of the present invention is shown in FIG. 5. As discussed above, the metal reactant, such as Zn, is evaporated in evaporator 145, which comprises an evaporation chamber. Evaporator 145 is connected to conduit 144 to provide a flow of the evaporated reactant to injection holes 134. In this embodiment, instead of using a Zn slug, for example, a Zn wire 152 is fed to the evaporator 145 through a wire feed conduit or hollow tube 151 connected to a wire feed supply 153, such as a spool of Zn wire. Of course, other metals can be utilized as the metal reactant, as described above.

Wire feed supply 153 can be unspooled by a conventional motor 154. In one embodiment, a motor 154 is driven at a constant rate to continuously feed wire 152 into evaporator 145. In addition, Ar gas can be fed through conduit 151 via tube 157. Argon is used to reduce back diffusion of oxygen, to carry the zinc vapors, and to dilute the zinc activity at the entrance to the plasma at injection holes 134.

The two embodiments shown in FIGS. 4 and 5 also illustrate two modes of operation that produce acceptable results. For example, the plasma enhanced evaporation apparatus of the present invention can be used in a batch mode. In the batch mode, a metal reactant, such as a slug of Zn or an indium-zinc alloy (In:Zn) is placed within evaporator 145. Nozzle 8 is brought to thermal equilibrium while the evaporator is rapidly cycled up and down to start and stop reactant deposition. Alternatively, in a continuous mode, the evaporator 145 and nozzle 8 are brought to equilibrium via heating element 147. Wire 152 is fed into the evaporator 145 where it melts and evaporates into the plasma 150 at a constant rate proportional to the feed rate of the wire and the vapor pressure of the reactant at the evaporator temperature. The continuous mode is advantageous in that it minimizes any waste of the evaporated reactant. The evaporator can be kept at the proper elevated temperature for as long as a user desires. The feed rate of the reactant wire can also be varied accordingly. Of course, variations or combinations of these modes of operation can also be utilized to produce acceptable deposition runs, as will be apparent to those of skill in the art given the present description.

The stability of ZnO is generally improved by utilizing arc plasma deposition in which solid zinc is evaporated into the plasma (APD/evap.). According to this method, and as show in examples 8–11 below in Table 2, the ZnO deposits contain a stoichiometric excess of oxygen (i.e. greater than 50% oxygen). By contrast, when an organometallic zinc source is used with arc plasma deposition (examples 12–13) or when sputtering is used (examples 14–16), the ZnO deposit generally contains a stoichiometric deficiency of oxygen. The oxygen and zinc content in examples 8–16 was measured by X-ray photoelectron spectroscopy (XPS).

TABLE 2

| Example | Zinc Source | Deposit Method | % oxygen of coating | % zinc of coating |
|---|---|---|---|---|
| 8 | Zn | APD/evap. | 54.3 | 45.7 |
| 9 | Zn | APD/evap. | 54.0 | 46.0 |
| 10 | Zn | APD/evap. | 53.9 | 46.1 |
| 11 | Zn | APD/evap. | 53.5 | 46.5 |
| 12 | DEZ | APD | 42.8 | 52.6 |
| 13 | DMZ | APD | 31.9 | 61.5 |
| 14 | ZnO | Sputter | 45.3 | 49.8 |
| 15 | ZnO | Sputter | 46.9 | 48.1 |
| 16 | ZnO | Sputter | 38.0 | 61.6 |

The following examples 17–20 illustrate differences in water soak stability of ZnO layers deposited by various methods. In example 17, the ZnO layer was deposited by arc plasma deposition in which the zinc was evaporated into the plasma. In examples 18 and 19, the ZnO layer was deposited by arc plasma deposition (APD) in which the zinc source was diethyl zinc (DEZ). In example 20, the ZnO layer was deposited by reactive sputtering with a ZnO source in an 18% $O_2$/Ar plasma. ΔOD per day for 21 days refers to the average decrease per day in optical density over 21 days of water soak in 65° C. water, where OD is equivalent to the absorbance of 350 nm radiation, as defined above. This loss in OD is due to dissolution of the ZnO coating. Δ% haze after 7 days refers to the increase in haze after 7 days of water soak in 65° C. water. The lower the value for ΔOD per day and Δ% haze, the more stable the coating.

TABLE 3

| Example | Method | zinc source | Δ OD per day for 21 days | Δ % haze after 7 days |
|---|---|---|---|---|
| 17 | APD/evap. | Zn | 0.016 | 1.7 |
| 18 | APD | DEZ | 0.077 | 18 |
| 19 | APD | DEZ | 0.155 | 18 |
| 20 | Sputtering | ZnO | 0.45 | 17.0(3days) |

As shown in Table 3, the ZnO layer formed by arc plasma deposition with evaporated zinc exhibited a significantly lower decrease in optical density per day as compared with the ZnO layers formed by sputtering and by arc plasma deposition with DEZ. Also, the ZnO layer formed by arc plasma deposition with evaporated zinc had a much lower increase in haze as compared with the ZnO layers formed by sputtering and by arc plasma deposition with DEZ. The examples in Tables 2 and 3 suggest that deposition of a ZnO coating having a stoichiometric excess of oxygen may produce ZnO layers with improved water soak stability.

Referring again to FIG. 1, the abrasion resistant layer 140 is formed on the UV absorbing layer 130 also by arc plasma deposition. To deposit the abrasion resistant layer, the flow of the organometallic or metallic material into the plasma is stopped, and the flow of another material is initiated. The transition between formation of the UV absorbing layer and formation of the abrasion resistant layer may be made simply by injecting another material without interrupting generation of the plasma.

The transition may also be carried out to provide a gradual transition between materials, i.e. a graded composition. This may be accomplished by initiating injection of the material for the abrasion resistant layer prior to terminating injection of the material for the UV absorbing layer. The graded transition can provide the advantage of improved adhesion between the UV absorbing layer and the abrasion resistant layer, since there is no abrupt transition between materials having different properties.

The materials which are injected into the plasma to form the abrasion resistant layer may include octamethylcyclotetrasiloxane (D4) tetramethyldisiloxane (TMDSO), hexamethyldisiloxane (HMDSO), or other organosilicon, as described above. The organosilicon monomers are typically oxidized and polymerized in the plasma to form an abrasion resistant layer which comprises an oxidized D4, TMDSO, or HMDSO layer containing silicon, carbon, oxygen, and hydrogen.

Other examples of materials suitable for the abrasion-resistant layer include silicon dioxide and aluminum oxide, for example.

The abrasion resistant layer is generally about 1–10 microns thick, more typically about 2–6 microns thick, most typically about 3–4 microns thick. The abrasion resistant layer may have a deposition rate of about 12–15 microns per minute such that a layer 4 microns thick can be deposited in about 20 seconds.

The following examples further illustrate various features and advantages of exemplary embodiments of the invention.

EXAMPLE 21

This example of a three layer article exhibited good abrasion resistance and good UV absorbance.

A LEXAN® polycarbonate article (4 inches×4 inches×⅛ inch) was arc plasma coated with: 1) an interlayer of polymerized D4 0.6 microns thick; 2) a UV absorbing layer of ZnO 0.5 microns thick; and 3) an abrasion resistant layer of oxidized D4 4 microns thick under the conditions listed in Table 4 below. The three layers were deposited discretely, with a time lag of 30 minutes between deposition of layers. In Tables 4 and 5, under "plasma exposure", "pre/dep/post" refers to plasma exposure before, during and after deposition of the layer in question. For the interlayer, the pre- and post-deposition plasma comprised Argon. For the UV absorbing layer and abrasion resistant layers, the pre- and post-deposition plasma comprised argon and oxygen. The working distance from the anode to the substrate was 28 cm. The arc current was 60 A.

The coated article was optically clear with an initial haze (percentage of light scattering) of 0.6%, as measured with a Gardner haze-gard plus, Model HB 4725, according to ASTM Test Method ASTM D1003. The sample was then subjected to the Taber Abrasion Test, ASTM Test Method D1044. In the Taber Abrasion Test, the sample is subjected to a load of 1000 grams evenly distributed on two wear wheels (type CS-10F) for 1000 cycles. The haze is then measured again to obtain a delta haze value. The lower the delta haze value, the more abrasion resistant is the sample. In this example, the delta haze value was 1.2%.

The UV absorbance of the UV absorbing layer was measured by coating the same ZnO layer on a glass substrate. The ZnO coating had a UV absorbance of greater than 1.5 for 350 nanometer (nm) light. Glass was used as a substrate for the purpose of measuring the UV absorbance, since polycarbonate absorbs some UV light.

TABLE 4

| Layer | interlayer | UV absorb layer | abrasion layer |
|---|---|---|---|
| chamber pressure (mT) | 27 | 53 | 35 |
| argon flow (slm) | 2.0 | 1.25 | 1.5 |

TABLE 4-continued

| Layer | interlayer | UV absorb layer | abrasion layer |
|---|---|---|---|
| oxygen flow (slm) | 0 | 3.2 | 1.0 |
| D4 flow (slm) | 0.7 | — | 0.7 |
| DEZ flow (slm) | — | 0.28 | — |
| plasma exposure (sec) (pre/dep/post) | 8/2/5 | 1/12/1 | 5/25/5 |
| thickness (μm) | 0.6 | 0.5 | 4.0 |

EXAMPLE 22

A three-layer coating was applied to a LEXAN® polycarbonate substrate (4 inches×4 inches×⅛ inch) under the conditions listed in Table 5 below. The working distance from the anode to the substrate was 28 cm. The arc current was 60 A. This example of a three-layer coating exhibited good abrasion resistance, good UV absorption, and no damage from thermal cycling.

The coating had an initial haze of 1.2%, as measured with a Gardner haze-gard plus, Model HB 4725. The coating was then subjected to the Taber test as described in Example 21. The sample had a delta haze of 2.0%.

The coated article was then subjected to a thermal cycling test, defined in General Motors Engineering Standards, Automotive Environmental Cycles GM9505P (1992). The thermal cycling test (identified as Cycle I in the General Motors Engineering Standards) involved heating and cooling the sample between −30° C. and 80° C. for 5 cycles. At the conclusion of the thermal cycling test, the sample exhibited no microcracking or delamination of the coatings.

The UV absorbance of the UV absorbing layer was measured by coating the same ZnO layer on a glass substrate. The ZnO coating had a UV absorbance of about 1.6 for 350 nanometer light.

TABLE 5

| Layer | interlayer | UV absorb layer | abrasion layer |
|---|---|---|---|
| chamber pressure (mT) | 27 | 53 | 32 |
| argon flow (slm) | 2.0 | 1.25 | 1.5 |
| oxygen flow (slm) | 0 | 3.2 | 0.8 |
| D4 flow (slm) | 0.7 | — | 0.7 |
| DEZ flow (slm) | — | 0.28 | — |
| plasma exposure (sec) (pre/dep/post) | 5/5/5 | 1/12/1 | 5/30/5 |
| thickness (μm) | 1.3 | 0.5 | 4.6 |

EXAMPLE 23

A three-layer coating was applied to a Lexan® substrate under the conditions listed in Table 6 below. The three-layer coating included an interlayer, a UV absorbing layer, and an abrasion resistant layer. The abrasion resistant layer was applied in two steps. This example demonstrated that the interlayer, the UV absorbing layer, and the first abrasion resistant layer could be applied successively without cooling in a short period of time to reduce the thermal load on the LEXAN® substrate.

As described in Table 6, the LEXAN® substrate was pretreated with an argon plasma for 4 seconds. The interlayer was then deposited without interruption in the arc by turning on the TMDSO flow. The UV absorbing ZnO layer was then deposited without interruption in the arc by turning on the DMZ and oxygen flow, and turning off the TMDSO flow. A first abrasion resistant layer was then deposited without interruption in the arc by turning on the TMDSO flow, turning off the DMZ flow, and lowering the oxygen flow. The sample was then allowed to cool for about 5 minutes to 40° C. A second abrasion resistant layer was then applied. The working distance from the anode to the surface of the substrate was 25.5 centimeters.

These conditions resulted in a three-layer structure with an 0.5 micron interlayer of polymerized TMDSO, a 0.5 micron UV absorbing layer of zinc oxide, and a 3.6 micron abrasion resistant layer of oxidized TMDSO. The sample, after being soaked in 65° C. water for 7 days, experienced no delamination or increase in haze. The haze was measured before and after the water soak with a Gardner hazemeter Model XL 835.

TABLE 6

| Step | pre-treat | inter-layer | UV absorb layer | abrasion layer 1 | abrasion layer 2 |
|---|---|---|---|---|---|
| current (amps) | 50 | 50 | 50 | 50 | 60 |
| argon flow (slm) | 2.0 | 2.0 | 2.0 | 2.0 | 2.0 |
| oxygen flow (slm) | — | — | 7.0 | 1.75 | 1.75 |
| TMDSO flow (slm) | — | 0.7 | — | 0.7 | 0.7 |
| DMZ flow (slm) | — | — | 0.7 | — | — |
| dep time (sec) | 4 | 6 | 5 | 10 | 10 |
| pressure (mT) | 39 | 46 | 107 | 65 | 65 |

EXAMPLE 24

A three-layer coating was applied to a LEXAN® substrate under the conditions listed in Table 7 below. This example demonstrated a high ultraviolet absorbance of 2.66. The layers were deposited successively without an intermittent cooling step in a total of 13 seconds. The total thickness of the coating was 1.8 microns. The working distance between the anode and the surface of the substrate was 25.5 centimeters.

TABLE 7

| layer | interlayer | UV absorbing layer | abrasion resist layer |
|---|---|---|---|
| current (amps) | 50 | 40 | 50 |
| pressure (mT) | 38 | 115 | 49 |
| Ar flow (slm) | 2.0 | 1.25 | 2.0 |
| $O_2$ flow (slm) | — | 7.0 | 0.8 |
| D4 flow (slm) | 0.7 | — | 0.7 |
| DMZ flow (slm) | — | 0.7 | — |
| dep time (sec) | 4 | 4 | 5 |
| UV absorbance | — | 2.66 | — |

EXAMPLE 25

A three-layer coating was applied to a LEXAN® substrate under the conditions listed in Table 8 below. The coating had a relatively high UV absorbance of 2.29. The layers were deposited successively without an intermittent cooling step in a total of 32 seconds. The total thickness of the coating was 3.6 microns. The working distance between the anode and the surface of the substrate was 25.5 centimeters.

TABLE 8

| layer | interlayer | UV absorbing layer | abrasion resist layer |
|---|---|---|---|
| current (amps) | 50 | 50 | 50 |
| pressure (mT) | 39 | 107 | 65 |
| Ar flow (slm) | 2.0 | 2.0 | 2.0 |
| $O_2$ flow (slm) | — | 7.0 | 2.0 |
| TMDSO flow (slm) | 0.3 | — | 0.3 |
| DMZ flow (slm) | — | 0.7 | — |
| dep time (sec) | 6 | 6 | 20 |
| UV absorbance | — | 2.29 | — |

From the above examples and description, it is apparent that exemplary embodiments of the invention provide an improved method for rapidly forming a plurality of layers, including an interlayer, a UV absorbing layer, and an abrasion resistant layer, on a polymer substrate. The timing which can be achieved is particularly advantageous, since the three layers can be applied successively in a total deposition time of less than 1 minute, typically less than 45 seconds, 30 seconds; 20 seconds, or 15 seconds, with or without intermittent cooling between deposition of layers. The UV absorbance can be greater than or equal to 2 or 2.5, for example. The abrasion resistance, as determined with the Taber Abrasion Test, can have a delta haze value of less than or equal to 2%, 1.5%, or 1.2%, for example. The exemplary nozzle shown in FIG. 3 also allows relatively large surface areas to be coated quickly.

Figure 6:
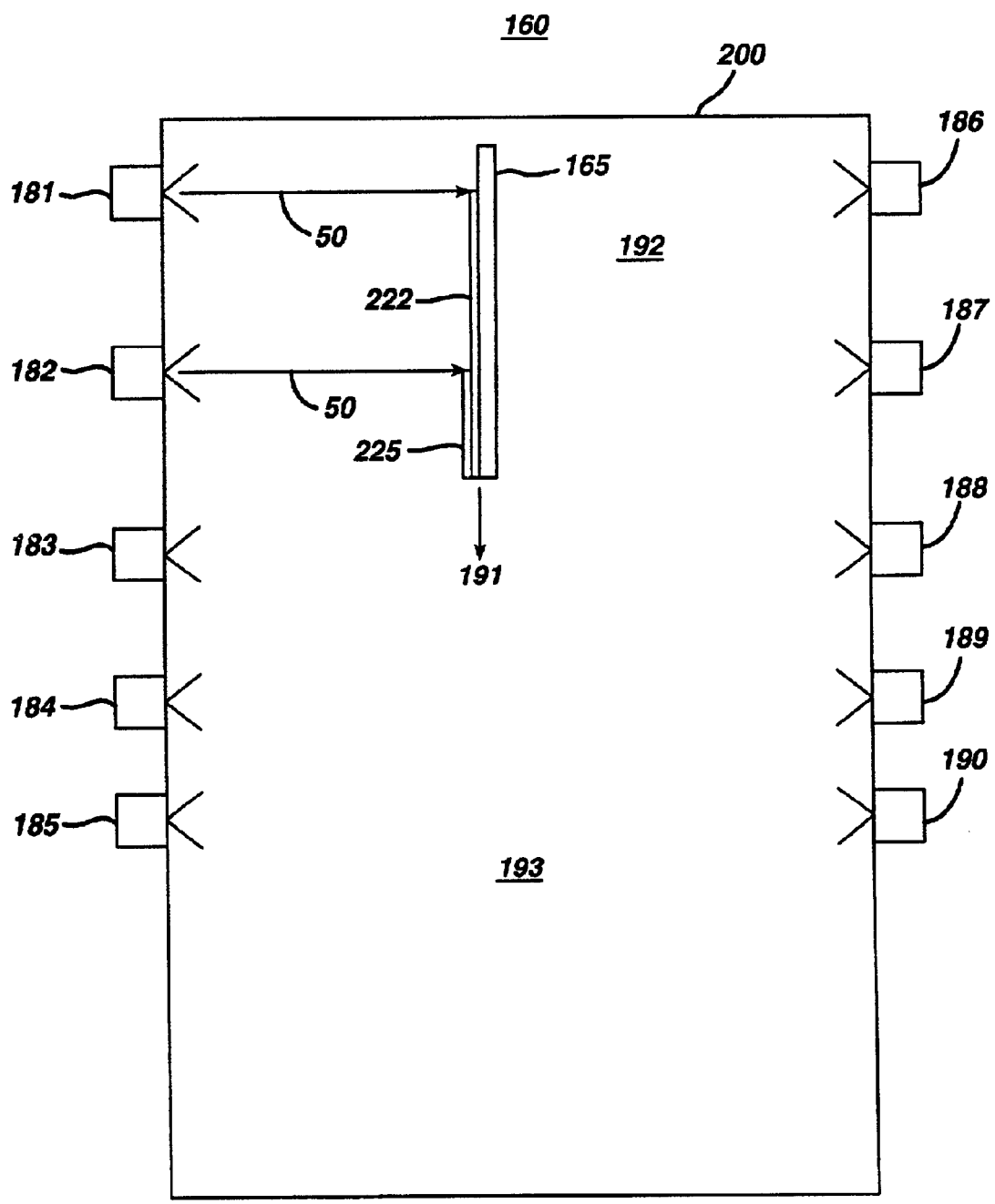
FIG. 6 is a drawing of another embodiment of the invention which includes a plurality of plasma generation chambers.

In another embodiment shown in FIG. 6, an arc plasma deposition apparatus 160 is configured with plural plasma generation chambers 181–190 positioned on both sides of a substrate 165 in a deposition chamber 200. The plasma generation chambers 181–190 and the deposition chamber 200 operate as described above with respect to FIGS. 2–5.

The embodiment of FIG. 6 can coat either one surface or simultaneously coat both surfaces of a substrate 165, such as a vehicle window. The plurality of arc plasma generation chambers may be placed only on one side of the deposition chamber 200, or on opposite sides, as shown in FIG. 6. While five plasma generation chambers are shown on each side of the substrate 165, there may be one, two, three, four, or more than five such chambers on either side of the substrate 165. The apparatus 160 may be utilized to separately coat multiple regions of a single substrate, to coat multiple substrates, or to coat multiple layers on a single substrate, for example. The plasma generation chambers 181–190 may be configured to project a desired material or combination of materials onto the substrate 165.

In the example shown in FIG. 6, the substrate 165 is coated with plural overlying layers. The substrate 165 can be translated along a direction 191 normal to the path of the emitted plasma jets. This direction may be vertical, horizontal or any direction therebetween. For example, the substrate may be moved from location 192 toward location 193, normal to the direction of the plasma arcs or jets 50 emitted from chambers 181–185. According to one example, plasma generation chamber 181 is used to deposit an interlayer 222, plasma generation chamber 182 is used to deposit a UV absorbing layer 225, and plasma generation chamber 183 is used to deposit an abrasion resistant layer. Of course the number of active plasma generation chambers (i.e., chambers emitting a plasma) may be varied to form a desired structure. Also, one or more of the plasma generation chambers 181–190 can be used for plasma treatment, such as the pre- and post-plasma exposure described in Tables 4 and 5.

Plasma generation chambers 186–190 may be active if it is desired to coat the back side of substrate 165. Thus, any combination of layers may be formed in the same chamber 200 during the same process run. Furthermore, if the substrate 165 is long enough to simultaneously face chambers 181–185, then substrate 165 may be simultaneously irradiated by plasmas from more than two to all five active chambers 181–185 to form any combination of layers, simultaneously.

The coating layers may also be deposited sequentially. For example, each one of the deposition chambers 181–183 can be operated at different times while the other two deposition chambers are inactive to sequentially deposit an interlayer, a UV absorbing layer, and an abrasion resistant layer. The substrate 165 is positioned appropriately for each deposition, i.e., in front of the active deposition chamber.

According to a further embodiment of the invention, an adhesion promoting layer of silver or aluminum can be deposited adjacent to the UV absorbing layer. A suitable silver or aluminum adhesion promoting layer is described, for example, in U.S. Pat. No. 6,420,032, entitled "Adhesion Layer for Metal Oxide UV Filters", issued on Jul. 16, 2002, to Charles Iacovangelo, which is hereby incorporated by reference in its entirety.

According to a still further embodiment of the invention, a silver or aluminum infrared reflecting layer can be incorporated into the multilayer article, e.g. adjacent to the UV absorbing layer, as described, for example in U.S. Pat. No. 6,261,694, entitled "Infrared Reflecting Coatings", issued on Jul. 17, 2001, to Charles Iacovangelo, which is hereby incorporated by reference in its entirety.

The method is particularly suitable for coating articles which are manufactured by extrusion or injection molding, since these processes also can be carried out rapidly. For example, the logistics of manufacturing are simplified if the time it takes to form the article is roughly equivalent to the time it takes to coat the article, since these processes can be carried out in series. By contrast, in prior methods where a process step such as silicone hard coating takes 2 hours, a great number of articles must be processed simultaneously, which complicates manufacturing logistics. The application of all layers by arc plasma deposition also provides the advantage that the article need not be handled, transported, or cleaned between depositions of different layers.

Other embodiments of the invention will be apparent to those skilled in the art from a consideration of this specification or practice of the invention disclosed herein. It is intended that the specification and examples be considered as exemplary only, with the true scope and spirit of the invention being defined by the following claims.

What is claimed is:

1. A method of depositing a plurality of layers on a substrate, the method comprising steps of:

flowing a plasma gas in a plasma generation chamber in communication with a deposition chamber, the deposition chamber having a lower pressure than the plasma generation chamber, the article being disposed in the deposition chamber;

generating an arc in the plasma generation chamber to create a plasma, which flows into the deposition chamber;

injecting a first material comprising and a first oxidant at least one of a polymerizable hydrocarbon and an organosilicon material into the plasma and reacting the first material to form an interlayer on the substrate, the interlayer comprising a polymerized organosilicon material; and injecting a second material comprising and a second oxidant at least one of an elemental metal and an organometallic compound into the plasma and reacting the second material to form a second layer comprising an inorganic ultraviolet absorbing material on the interlayer, the second material comprising a gaseous reagent, wherein the interlayer has a coefficient of thermal expansion that is between that of the substrate and the second layer.

2. The method of claim 1, wherein the the second material comprises an evaporated elemental metal.

3. The method of claim 1, further comprising the step of injecting a third material into the plasma to form a third layer and reacting the third material to form a third layer comprising an abrasion resistant material on the second layer.

4. The method of claim 3, wherein the first material comprises a first organosilicon material, the second material comprises an evaporated elemental metal, and the third material comprises a second organosilicon material, and the method further comprises the step of injecting a third oxidant with the third material.

5. The method of claim 4, wherein the first material comprises at least one of octamethylcyclotetrasiloxane, tetramethyldisiloxane, and hexamethyldisiloxane, the second material comprises zinc, and the third material comprises at least one of octamethylcyclotetrasiloxane, tetramethyldisiloxane, and hexamethyldisiloxane.

6. The method of claim 3, wherein the first material comprises a hydrocarbon.

7. The method of claim 3, wherein the second material comprises an evaporated elemental metal.

8. The method of claim 7, wherein the second material comprises at least one of zinc and indium.

9. The method of claim 7, wherein the second material comprises zinc, and the method further comprises the step of injecting sulfur with the zinc.

10. The method of claim 4, wherein the substrate comprises a polycarbonate.

11. The method of claim 3, wherein the second layer comprises an ultraviolet absorbing material having an ultraviolet absorbance value of at least 1.0.

12. The method of claim 11, wherein the second layer comprises an ultraviolet absorbing material and wherein the ultraviolet absorbance value is at least 2.0.

13. The method of claim 11, wherein the abrasion resistant material has a delta haze value of at most 4.0 percent.

14. The method of claim 12, wherein the abrasion resistant material has a delta haze value of at most 2.0 percent.

15. The method of claim 1, wherein the substrate comprises glass.

16. The method of claim 3, wherein the second material comprises at least one of elemental zinc, elemental indium, and elemental aluminum.

* * * * *